US006392486B1

(12) United States Patent
Lemay, Jr.

(10) Patent No.: US 6,392,486 B1
(45) Date of Patent: May 21, 2002

(54) LOW-NOISE COMMON-GATE AMPLIFIER FOR WIRELESS COMMUNICATIONS

(75) Inventor: Normand T. Lemay, Jr., Minneapolis, MN (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/929,905

(22) Filed: Aug. 14, 2001

(51) Int. Cl.[7] ............................................... H03F 3/45

(52) U.S. Cl. ....................................... 330/253; 330/307

(58) Field of Search .................................. 330/253, 307

(56) References Cited

U.S. PATENT DOCUMENTS

| | | | |
|---|---|---|---|
| 3,384,832 A | * 5/1968 | Mayeur | 330/54 |
| 3,836,706 A | * 9/1974 | Keegan et al. | 178/5.2 D |
| 5,623,231 A | * 4/1997 | Mohwinkel et al. | 330/276 |
| 5,734,298 A | * 3/1998 | Nagaya et al. | 330/253 |
| 5,963,094 A | 10/1999 | Linder et al. | |
| 6,005,438 A | * 12/1999 | Shing | 330/253 |
| 6,046,641 A | * 4/2000 | Chawla et al. | 330/277 |
| 6,094,084 A | 7/2000 | Abou-Allam et al. | |

OTHER PUBLICATIONS

Rofougaran, A. et al., "A Single–Chip 900–MHz Spread–Spectrum Wireless Tranceiver in 1–$\mu$m CMOS—Part II: Receiver Design", IEEE Journal of Solid–State Circuits, vol. 33, No. 4, pp. 535–547 (Apr. 1998).

* cited by examiner

Primary Examiner—Robert Pascal
Assistant Examiner—Henry Choe
(74) Attorney, Agent, or Firm—Eduardo E. Drake

(57) ABSTRACT

With emergence of Bluetooth™ and other wireless standards, it has become increasingly desirable and practical to use low-cost wireless links, instead of cables, between devices, such as computers, printers, and personal digital assistants. Vital to these wireless links are the amplifiers that receive transmitted signals. One amplifier form, known as a common-gate amplifier, generally includes bias circuitry that requires large areas of an integrated-circuit chip or increases power usage and adds noise. Accordingly, the inventor devised an exemplary common-gate amplifier that includes an inductor coupled between the gate and drain of an amplifying transistor. The inductor acts as a short circuit at low frequencies, forcing the transistor to function at these frequencies as a diode and thus reduces the need for further bias circuitry. Other inventive embodiments include wireless receivers, transceivers, programmable integrated circuits, and electronic devices that incorporate the exemplary amplifier.

22 Claims, 4 Drawing Sheets

LOW-NOISE COMMON-GATE AMPLIFIER FOR WIRELESS COMMUNICATIONS

TECHNICAL FIELD

The present invention concerns amplifiers with low-noise and low-power characteristics, particularly common-gate amplifiers for wireless communications.

BACKGROUND

Today there are a wide variety of computer and telecommunications devices, such as personal computers (PCS), mobile telephones, and personal data assistants (PDAs), that need to share information with each other. Typically, this information is shared using electrical cables connecting one device to another.

However, in recent years, it has become increasingly desirable and practical to replace the awkward cable connections with wireless (radio) communications links between devices. Evidencing this expansion in wireless connectivity is the growing acceptance of several standards for wireless voice and data communications, such as the Institute of Electrical and Electronic Engineers (IEEE) 802.11 wireless standards, the HomeRF standards, and the Bluetooth wireless standard. (HomeRF is a trademark of the HomeRF Working Group, Inc. of Portland, Oreg.; Bluetooth™ is a trademark owned by Telefonaktiebolaget L M Ericsson of Sweden.)

Bluetooth wireless technology holds the promise of allowing users to simply turn on their electronic devices and have them automatically and instantaneously establish wireless communications with other nearby Bluetooth-compliant devices. For example, it is expected that one will buy a compliant printer, take it home, turn it on, and have it automatically establish a wireless connection with a nearby computer, mobile telephone, digital camera, and/or personal digital assistant, enabling all these devices to print data on the printer from anywhere in the home.

One vital component to the function of Bluetooth-compliant devices as well as other devices with wireless connectivity is the radio receiver that receives transmitted signals. Although the receiver includes numerous components of relatively great complexity, none are more essential than a low-noise amplifier—the circuit that receives input signals from the antenna, and amplifies or scales the signals to make it easier to detect the information they carry.

Two important traits of these amplifiers is their power consumption and noise performance. Lower power consumption is desired, particularly in battery-powered devices, to extend battery life. And, excellent noise performance is desired to avoid masking or corrupting communication signals with noise from the amplifiers.

In one conventional form of amplifier, known as a common-gate amplifier, extra bias circuitry has typically been added to bias (or shift) transistors in the amplifier to an active operating region, thereby reducing distortion of received signals. However, the extra bias circuitry not only consumes considerable surface area on an integrated circuit, but also increases power consumption and introduces noise into the amplifier.

Accordingly, there is a need for better common-gate amplifiers for radio in radio receivers, particularly Bluetooth-compliant radios.

To address these and other needs, the present inventor devised several unique common-gate amplifiers. In particular, one exemplary common-gate amplifier includes a field-effect transistor, a current source, and an inductor. The field-effect transistor includes a gate, a drain, and a source. The current source is coupled between a supply node and the drain, and the inductor is coupled between the gate and the source. The inductor behaves as a short circuit at low frequencies, forcing the field-effect transistor to function as a diode and thus eliminates the need for additional circuitry to bias the transistor. To this extent, the amplifier is considered self biased.

The exemplary embodiment further includes a load circuit coupled between the source of the field-effect transistor and another supply node. One exemplary load circuit comprises a field-effect transistor with a feedback resistor between its control gate and one of its non-control nodes. The resistor effectively configures the transistor as a diode, allowing it to exhibit a self-biasing characteristic and thus eliminating the need to apply a separate bias voltage to the transistor.

Other aspects of the invention include a receiver, a transceiver, and an electronic device incorporating amplifiers of the present invention. Another aspect is a programmable integrated circuit having a transceiver and one or more programmable logic devices.

DETAILED DESCRIPTION OF EXEMPLARY EMBODIMENTS

The following detailed description, which references and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

Exemplary Common-Gate Amplifier

Figure 1:
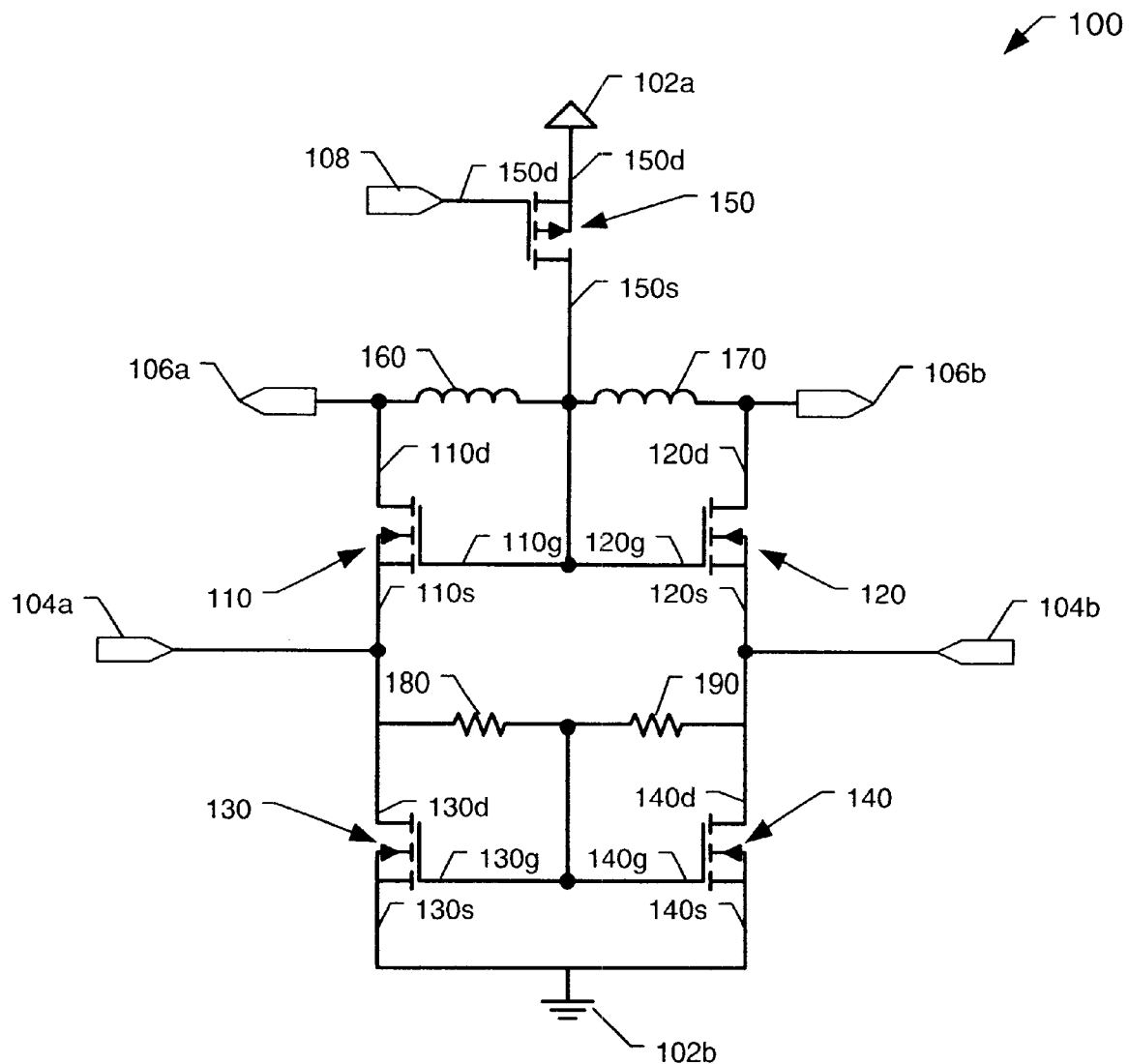
FIG. 1 is a schematic diagram of an exemplary differential amplifier circuit 100 incorporating teachings of the invention.

FIG. 1 shows an exemplary differential amplifier circuit 100 incorporating teachings of the present invention. In particular, amplifier circuit 100 includes voltage supply nodes 102a and 102b, which in the exemplary embodiment provide respective voltages of 1.8 and 0.0 volts. Circuit 100 also includes differential input nodes 104a and 104b, differential output nodes 106a and 106b, bias control node 108, n-channel metal-oxide-semiconductor field-effect transistors (mosfets) 110, 120, 130, and 140, and a p-channel mosfet 150. Transistors 110–150 have respective control gates (or nodes) 110g–150g, drains 110d–150d, and sources 110s–150s. Circuit 100 further includes inductors 160 and 170, and resistors 180 and 190.

More particularly, transistors 110 and 120 serve as symmetric amplifying elements. Transistor 110 has its source 110s coupled to differential input node 104a, its drain 110d coupled to differential output node 106a, and its gate 110g coupled to the gate of transistor 120, placing transistors 110 and 120 in a common-gate configuration. Source 120g is coupled to differential input node 104b, and drain 120d is coupled to differential output node 106b.

Transistors 130 and 140, which are also coupled in a common-gate configuration, serve as a symmetrical active load. Transistor 130 has its drain 130d coupled to differential input node 104a, its source 130s coupled to supply node 102b, and its gate 130g coupled to gate 140g of transistor 140. Drain 140d is coupled to differential input node 104b, and source 140s is coupled to supply node 102b.

Transistor 150, which functions as a current source, has its gate 150g coupled to bias control node 108, its drain 150d coupled to supply node 102a, and its 150s coupled to gates 110g and 120g. In some embodiments, bias transistor 150 is coupled between supply node 102b and the sources of transistors 130 and 140, with gates 110g and 120g coupled to supply node 102a.

Inductor 160 is coupled between gate 110g and drain 110d, effectively configuring transistor 110 to function as a diode at low frequencies. Similarly, inductor 170, which is coupled between gate 120g and drain 120d, couples transistor 120 in a diode configuration. In the exemplary embodiment, inductors 160 and 170 are each sized to provide about 12 nano-Henrys of inductance. However, in general, any inductance which is used to compensate for or self-resonate with the input capacitance of a next stage circuitry at the desired resonant frequency is believed to be within the scope of the invention. (Inductors 160 and 170 can be separate inductors or halves of a center-tapped inductor.) Resistors 180 and 190 are coupled respectively between gate 130g and drain 130d and between gate 140g and drain 140d. As a consequence, transistors 130 and 140 are also configured as diodes. In the exemplary embodiment, resistors 180 and 190 are each sized to provide about 2.6 kili-Ohms of resistance. This value has a negligible effect on the input resistance of the amplifier, which is the reciprocal of the transconductance of transistor 110, or 25 Ohms in the exemplary embodiment.

In operation, bias transistor 150 functions as a current source, providing a low-frequency (or direct current (DC)) bias current through transistors 110 and 120. Inductors 160 and 170 approximate short circuits at low frequency, effectively shorting gate 110g to drain 110d and gate 120g to drain 120d. With this effective shorting, transistors 110 and 120 function as diodes and thus exhibit a form of low-frequency self-bias. As a consequence, transistors 110 and 120, which are matched in the exemplary embodiment, each conduct one-half of the bias current. This biasing enables transistors 110 and 120 to provide linear amplification of high-frequency differential signals at input nodes 104a and 104b, with the differential output signals taken at drains 110d and 120d (or output nodes 105a and 105b.)

Transistors 130 and 140, in combination with resistors 180 and 190, provide an active load on input nodes 104a and 104b. To minimize impact of the load impedance on the input resistance or impedance of the amplifier, the exemplary embodiment sets this load impedance at least an order of magnitude greater than the differential input impedance of transistors 110 and 120. The differential input impedance of the amplifier (that is, the impedance looking into input nodes 104a and 104b) is thus twice the reciprocal of the transconductance of amplifiers 110 and 120, or 50 Ohms.

Other embodiments of the invention use other forms of active load circuits. For example, some embodiments replace transistors 130 and 140 and resistors 180 and 190 with a pair of inductors or a single center-tapped inductor. (Embodiments using the center-tapped inductor coupled the center tap to ground.) Still other embodiments retain transistors 130 and 140 and provide a separate bias voltage to gates 130 and 140.

Exemplary Wireless Transceiver

Figure 2:
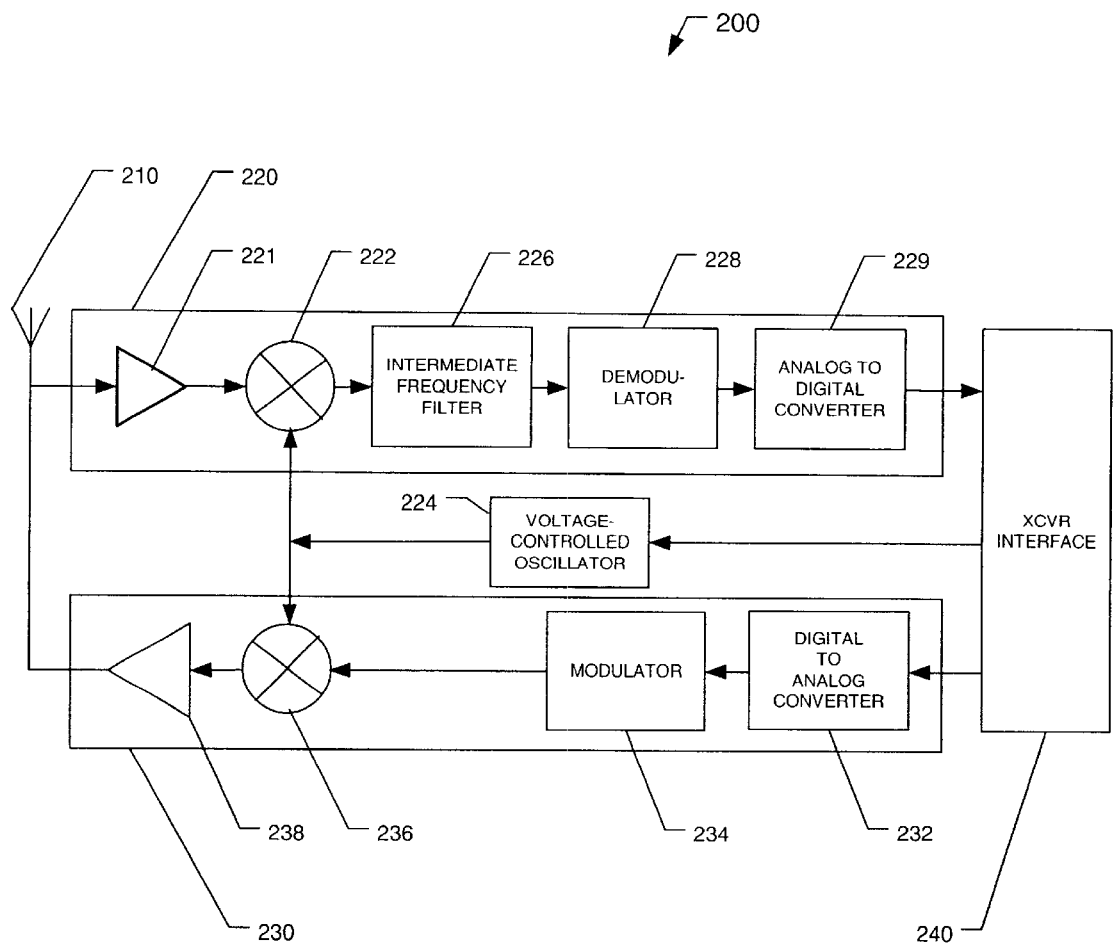
FIG. 2 is a block diagram of an exemplary wireless transceiver 200 incorporating amplifier circuit 100 of FIG. 1.

FIG. 2 shows an exemplary transceiver 200 that incorporating exemplary amplifier 100 of FIG. 1. In particular, transceiver 200, which operates according to well known principles, includes an antenna 210, a receiver 220, a transmitter 230, and a digital transceiver (XCVR) interface 240. Receiver 220 includes an amplifier 221, a mixer (or down-converter) 222, an intermediate-frequency (IF) filter 226, a demodulator 228, an analog-to-digital converter 229. Transmitter 230 comprises a digital-to-analog converter 232, a modulator 234, an up-converter 236, and an output power amplifier 238. Receiver 220 and transmitter 230 share antenna 210 and a voltage-controlled oscillator 224; however, other embodiments provide separate antennas and oscillators. The exemplary transceiver complies with one or more versions of the Bluetooth specification and thus receives and transmits signals in the 2.4 Gigahertz band. However, other embodiments use other frequency bands.

Exemplary Field Programmable Integrated Circuit

Figure 3:
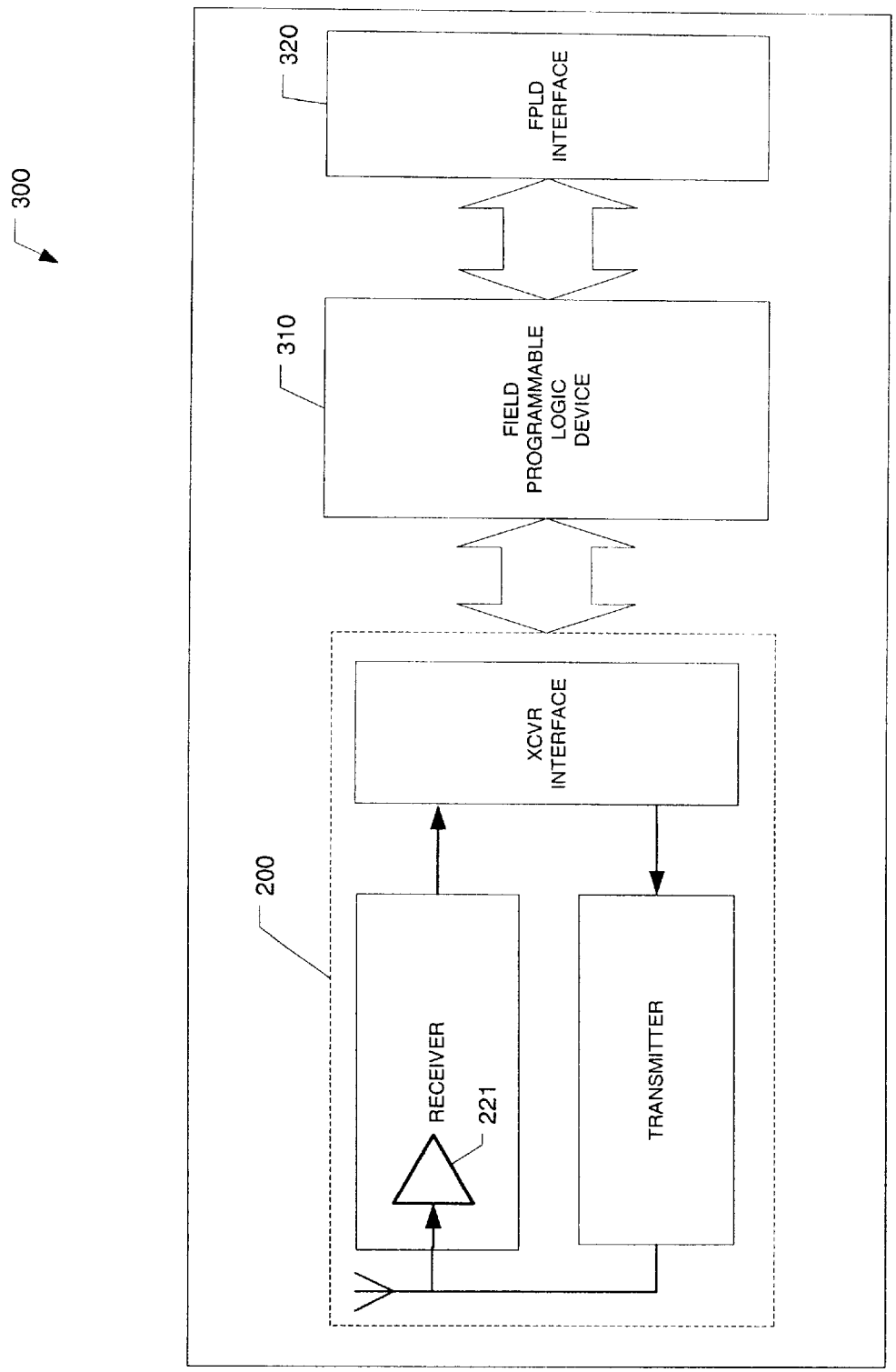
FIG. 3 is a block diagram of an exemplary field-programmable integrated circuit 300 incorporating wireless transceiver 200 of FIG. 2.

FIG. 3 shows a block diagram of an exemplary field-programmable integrated circuit 300 including exemplary wireless transceiver 200 (of FIG. 2.) Integrated circuit 300 also includes a field-programmable logic device (FPLD) 310, such as a field-programmable gate array (FPGA), and an FPLD interface 320. Although not shown for clarity of illustration, various embodiments of logic device 310 includes one or more individually and collectively configurable logic blocks, as well as an on-board processor and memory, which facilitate configuration of the device to perform desirable signal and data processing functions. FPLD Interface 320 provides conventional communications and program support capabilities.

Notably, the incorporation of wireless transceiver 200 also makes it possible to wirelessly program or reconfiguration the logic device 310 using a compatible wireless device with a conventional capability for programming field-programmable logic devices.

Exemplary System

Figure 4:
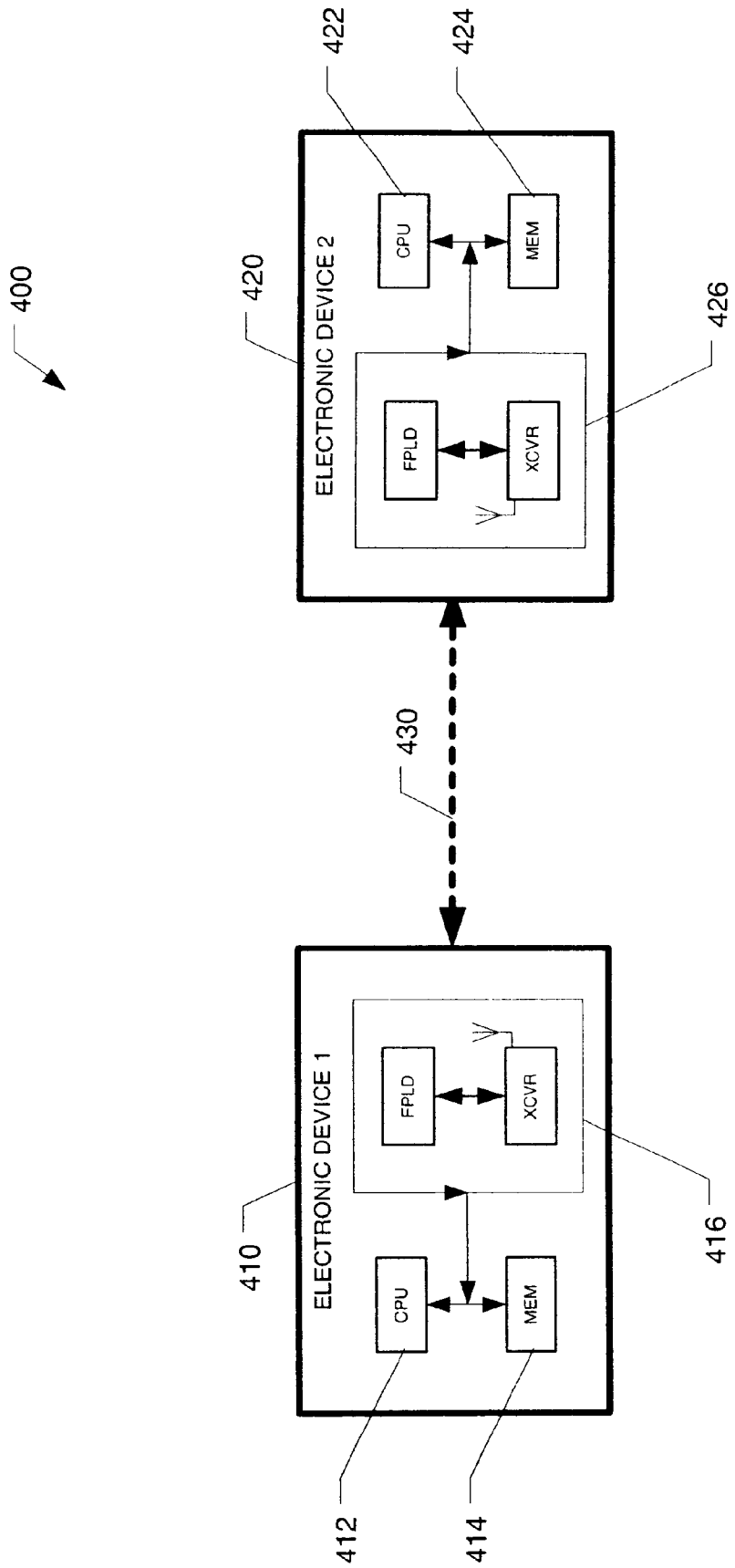
FIG. 4 is a block diagram of an exemplary system 400 including electronic devices that incorporate field-programmable integrated circuit 300.

FIG. 4 shows an exemplary system 400 including two or more electronic devices that incorporate field-programmable integrated circuit 300 of FIG. 3. In particular, system 400 includes electronic devices 410 and 420 and a wireless communications link 430. Devices 410 and 420 include respective processors 412 and 422, memories 414 and 424, and integrated programmable logic circuits 416 and 426. Circuits 416 and 426 incorporate the teachings of exemplary circuit 300 in FIG. 3 and thus provide devices 410 and 420 with capability for communicating over communications link 430 to each other (or to one or more other suitably equipped devices. Communications link 430 carries voice and/or digital data on a 2.4 Gigahertz carrier signal, according to a version of the Bluetooth communications protocol. However, other embodiments may use other communications protocols, such as one or more of the IEEE 802.11 or HomeRF standards.

Devices 410 and 420 can assume a wide variety of forms. For example, in various embodiments, one or both of the devices are a computer, monitor, mouse, key board, printer, scanner, fax machine, network communications device, personal digital assistant, cordless telephone, headset, mobile telephone, vehicle, appliance, entertainment equipment, and industrial controller. Indeed, virtually any device that currently communicates with another device wirelessly or via a cable or that would be more useful with such communication could incorporate teachings of the present invention.

Conclusion

In furtherance of the art, the inventor has presented a unique amplifier suitable for use in wireless communications applications, such as Bluetooth-compliant receivers, transceivers, programmable communications modules, and associated devices. The exemplary amplifier adopts a common-gate configuration of two matched field-effect transistors, with inductors coupling their respective control gates to their respective drains. An active load couples their sources to a supply node. Notably, this exemplary amplifier provides less bias circuitry and has lower power consumption than some conventional common-gate designs, making the amplifier more commercially competitive.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. An amplifier comprising
   an input node for receiving an input signal;
   an output node for outputting an amplified version of the signal;
   a supply node for coupling to a voltage supply; and
   a first transistor having a control node and first and second non-control nodes, with the control node inductively coupled to the first non-control node, the first non-control node coupled to the output node, and the second non-control node coupled to the input node.

2. The amplifier of claim 1, further comprising an inductor coupled between the control node and the first non-control node.

3. The amplifier of claim 2, wherein the first transistor and the inductor are integrated on a common substrate.

4. The amplifier of claim 1, wherein the first transistor is a field-effect device, and wherein the first non-control node is a drain, and the second non-control node is a source.

5. The amplifier of claim 1, further comprising a load coupled between the second non-control node and the supply node.

6. The amplifier of claim 5, wherein the load comprises a second transistor having a control node and first and second non-control nodes, with the control node of the second transistor coupled to the first non-control node of the second transistor and the second non-control node of the second transistor coupled to the supply node.

7. The amplifier of claim 6, further comprising a resistor coupled between the control node of the second transistor and the first non-control node of the second transistor.

8. An amplifier comprising:
   a pair of input nodes for receiving input signals, a pair of output nodes for outputting amplified versions of the signals, and a pair of supply nodes for coupling to a voltage supply;
   a first transistor having a first control node and first and second non-control nodes, with the first control node inductively coupled to the first non-control node, the first control node coupled to one of the output nodes, and the second non-control node coupled to one of the input nodes; and
   a second transistor having a second control node and first and second non-control nodes, with the second control node coupled to the first control node and inductively coupled to the first non-control node of the second transistor, the second control node of the second transistor coupled to the other of the output nodes, and the second non-control node of the second transistor coupled to the other of the input nodes.

9. The amplifier of claim 8, wherein the first and second transistors are field-effect transistors, and wherein the first non-control nodes are sources, the second non-control nodes are drains.

10. The amplifier of claim 8, further comprising
    a first inductor coupled between the first control node and the first non-control node of the first transistor; and
    a second inductor coupled between the second control node and the first non-control node of the second transistor.

11. The amplifier of claim 10, wherein the first and second transistors and the first and second inductors are integrated on a common substrate.

12. The amplifier of claim 9, further comprising first and second high-impedance loads, each coupled between a respective one of the input nodes and the second supply node.

13. An integrated amplifier circuit comprising:
    first and second supply nodes, output nodes, and input nodes;
    first and second transistors having respective first and second control nodes and first and second pairs of non-control nodes, with the first and second control nodes coupled together, one of the first pair of non-control nodes coupled to the first input node and the other of the first pair coupled to the first output node, one of the second pair of non-control nodes coupled to the second input node, the other of the second pair coupled to the second output node;
    third and fourth transistors having respective third and fourth control nodes and third and fourth pairs of non-control nodes, with the third and fourth control nodes coupled together, one of the third pair of non-control nodes coupled to the first input node and the other of the third pair coupled to the second supply node, one of the fourth pair of non-control nodes coupled to the second input node, the other of the fourth pair coupled to the second supply node;
    a first inductor coupled between the first control node and the first output node;
    a second inductor coupled between the second control node and the second output node;
    a first resistor coupled between the third control node and the first input node;
    a second resistor coupled between the fourth control node and the second input node; and
    a fifth transistor having a fifth pair of non-control nodes coupled between the first control node and the first supply node or between the other of the fourth pair of non-control nodes and second supply node.

14. The amplifier of claim 13, wherein the first and second transistors are field-effect transistors.

15. The amplifier of claim 13, wherein the first and second transistors are field-effect transistors, and wherein the one of the first pair of nodes is a source node, the other of the first pair of nodes is a drain node, the one of the second pair of nodes is a drain node.

16. The amplifier of claim 13, wherein the first and second inductors are respective first and second portions of a center-tapped inductor.

17. A wireless transceiver comprising:
an amplifier comprising:
first and second supply nodes, output nodes, and input nodes;
first and second transistors having respective first and second control nodes and first and second pairs of non-control nodes, with the first and second control nodes coupled together, one of the first pair of non-control nodes coupled to the first input node and the other of the first pair coupled to the first output node, one of the second pair of non-control nodes coupled to the second input node, the other of the second pair coupled to the second output node;
third and fourth transistors having respective third and fourth control nodes and third and fourth pairs of non-control nodes, with the third and fourth control nodes coupled together, one of the third pair of non-control nodes coupled to the first input node and the other of the third pair coupled to the second supply node, one of the fourth pair of non-control nodes coupled to the second input node, the other of the fourth pair coupled to the second supply node;
a first inductor coupled between the first control node and the first output node;
a second inductor coupled between the second control node and the second output node;
a first resistor coupled between the third control node and the first input node;
a second resistor coupled between the fourth control node and the second input node; and
a fifth transistor having a fifth pair of non-control nodes coupled between the first control node and the first supply node or between the other of the fourth pair of non-control nodes and second supply node;
an antenna having first and second antenna outputs coupled respectively to the first and second inputs of the amplifier;
an down-converter having first and second inputs and an output, with the first input coupled to the first output of the amplifier;
a filter having an input and an output, with the input coupled to the output of the down-converter; an analog-to-digital converter having an input and an output, with the input coupled to the output of the filter;
a voltage-controlled oscillator having an output coupled to the second input of the down-converter; and
an up-converter having an input coupled to the output of the voltage-controlled oscillator.

18. A programmable integrated circuit comprising:
a wireless transceiver comprising: an amplifier comprising:
first and second supply nodes, output nodes, and input nodes;
first and second transistors having respective first and second control nodes and first and second pairs of non-control nodes, with the first and second control nodes coupled together, one of the first pair of non-control nodes coupled to the first input node and the other of the first pair coupled to the first output node, one of the second pair of non-control nodes coupled to the second input node, the other of the second pair coupled to the second output node;
third and fourth transistors having respective third and fourth control nodes and third and fourth pairs of non-control nodes, with the third and fourth control nodes coupled together, one of the third pair of non-control nodes coupled to the first input node and the other of the third pair coupled to the second supply node, one of the fourth pair of non-control nodes coupled to the second input node, the other of the fourth pair coupled to the second supply node;
a first inductor coupled between the first control node and the first output node;
a second inductor coupled between the second control node and the second output node;
a first resistor coupled between the third control node and the first input node;
a second resistor coupled between the fourth control node and the second input node; and
a fifth transistor having a fifth pair of non-control nodes coupled between the first control node and the first supply node or between the other of the fourth pair of non-control nodes and second supply node;
an antenna having first and second antenna outputs coupled respectively to the first and second inputs of the amplifier;
an down-converter having first and second inputs and an output, with the first input coupled to the first output of the amplifier;
a filter having an input and an output, with the input coupled to the output of the down-converter; an analog-to-digital converter having an input and an output, with the input coupled to the output of the filter;
a voltage-controlled oscillator having an output coupled to the second input of the down-converter; and
an up-converter having an input coupled to the output of the voltage-controlled oscillator;
an interface coupled to an output of the wireless transceiver; and
a programmable logic device coupled to the interface.

19. An electronic device comprising:
a processor;
a memory coupled to the processor; and
a programmable integrated circuit coupled to the processor, the programmable integrated circuit comprising:
a wireless transceiver comprising:
an amplifier comprising:
first and second supply nodes, output nodes, and input nodes;
first and second transistors having respective first and second control nodes and first and second pairs of non-control nodes, with the first and second control nodes coupled together, one of the first pair of non-control nodes coupled to the first input node and the other of the first pair coupled to the first output node, one of the second pair of non-control nodes coupled to the second input node, the other of the second pair coupled to the second output node;
third and fourth transistors having respective third and fourth control nodes and third and fourth pairs of non-control nodes, with the third and fourth control nodes coupled together, one of the third pair of non-control nodes coupled to the first input node and the other of the third pair coupled to the second supply node, one of the fourth pair of non-control nodes coupled to the second input node, the other of the fourth pair coupled to the second supply node;
a first inductor coupled between the first control node and the first output node;
a second inductor coupled between the second control node and the second output node;
a first resistor coupled between the third control node and the first input node;
a second resistor coupled between the fourth control node and the second input node; and
a fifth transistor having a fifth pair of non-control nodes coupled between the first control node and the first supply node or between the other of the fourth pair of non-control nodes and second supply node;
an antenna having first and second antenna outputs coupled respectively to the first and second inputs of the amplifier;
an down-converter having first and second inputs and an output, with the first input coupled to the first output of the amplifier;
a filter having an input and an output, with the input coupled to the output of the down-converter; an analog-to-digital converter having an input and an output, with the input coupled to the output of the filter;
a voltage-controlled oscillator having an output coupled to the second input of the down-converter; and
an up-converter having an input coupled to the output of the voltage-controlled oscillator;
an interface coupled to an output of the wireless transceiver; and
a programmable logic device coupled to the interface.

20. An amplifier comprising:
first and second supply nodes;
a pair of input nodes for receiving differential communications signals;
first and second field-effect transistors having respective first and second control nodes and first and second pairs of non-control nodes, with the first and second control nodes coupled together, one of the first pair coupled to the first input node and the other of the first pair coupled to the first output node, one of the second pair coupled to the second input node, the other of the second pair coupled to the second output node;
means for self-biasing each of the first and second field-effect transistors; and
active self-biased means for loading the first and second field-effect transistors.

21. A method of operating an amplifier, the method comprising:
providing first and second field-effect transistors having respective gates, drains, and sources;
inductively coupling the first gate to the first drain and the second gate to the second drain;
drawing a DC bias current through the first and second field-effect transistors; and
receiving first and second input signals at the respective first and second sources.

22. The method of claim 21, wherein the first and second input signals each have a nominal frequency of about 2.4 GigaHertz.

* * * * *